(12) United States Patent
Muzzetto

(10) Patent No.: US 11,848,038 B2
(45) Date of Patent: Dec. 19, 2023

(54) SELF-REFERENCE SENSING FOR MEMORY CELLS

(71) Applicant: Micron Technology, Inc., Boise, ID (US)

(72) Inventor: Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/986,522

(22) Filed: Nov. 14, 2022

(65) Prior Publication Data

US 2023/0071819 A1 Mar. 9, 2023

Related U.S. Application Data

(60) Division of application No. 17/097,749, filed on Nov. 13, 2020, now Pat. No. 11,532,345, which is a
(Continued)

(51) Int. Cl.
*G11C 11/22* (2006.01)
*G06F 13/40* (2006.01)
*G11C 13/00* (2006.01)

(52) U.S. Cl.
CPC ...... *G11C 11/2297* (2013.01); *G06F 13/4022* (2013.01); *G11C 11/221* (2013.01);
(Continued)

(58) Field of Classification Search
CPC .................................................. G11C 11/2297
See application file for complete search history.

(56) References Cited

U.S. PATENT DOCUMENTS

| 4,888,733 A | 12/1989 | Mobley |
| 5,309,391 A | 5/1994 | Papaliolios |

(Continued)

FOREIGN PATENT DOCUMENTS

| CN | 1734665 A | 2/2006 |
| CN | 101261880 A | 9/2008 |

(Continued)

OTHER PUBLICATIONS

China National Intellectual Property Administration, "Office Action," issued in connection with Chinese Patent Application No. 201810723546.8, dated Aug. 8, 2019 (5 pages).
(Continued)

*Primary Examiner* — Douglas King
(74) *Attorney, Agent, or Firm* — Holland & Hart LLP

(57) ABSTRACT

Methods, systems, and apparatuses for self-referencing sensing schemes are described. A cell having two transistors, or other switching components, and one capacitor, such as a ferroelectric capacitor, may be sensed using a reference value that is specific to the cell. The cell may be read and sampled via one access line, and the cell may be used to generate a reference voltage and sampled via another access line. For instance, a first access line of a cell may be connected to one read voltage while a second access line of the cell is isolated from a voltage source; then the second access line may be connected to another read voltage while the first access line is isolate from a voltage source. The resulting voltages on the respective access lines may be compared to each other and a logic value of the cell determined from the comparison.

18 Claims, 8 Drawing Sheets

Related U.S. Application Data continuation of application No. 16/387,227, filed on Apr. 17, 2019, now Pat. No. 10,861,529, which is a division of application No. 15/641,783, filed on Jul. 5, 2017, now Pat. No. 10,304,514.

(52) U.S. Cl.
CPC ...... *G11C 11/2259* (2013.01); *G11C 11/2273* (2013.01); *G11C 11/2275* (2013.01); *G11C 2013/0057* (2013.01)

(56) References Cited

U.S. PATENT DOCUMENTS

| | | | |
|---|---|---|---|
| 6,198,654 B1 | 3/2001 | Ashikaga | |
| 6,483,737 B2 | 11/2002 | Takeuchi et al. | |
| 8,064,242 B2 | 11/2011 | Kim | |
| 9,552,864 B1 | 1/2017 | Vimercati | |
| 10,304,514 B2 * | 5/2019 | Muzzetto | G06F 13/4022 |
| 10,861,529 B2 * | 12/2020 | Muzzetto | G06F 13/4022 |
| 11,532,345 B2 * | 12/2022 | Muzzetto | G06F 13/4022 |
| 2003/0156463 A1 | 8/2003 | Casper et al. | |
| 2010/0135062 A1 | 6/2010 | Kim | |
| 2020/0257584 A1 | 8/2020 | Kinney et al. | |

FOREIGN PATENT DOCUMENTS

| | | |
|---|---|---|
| CN | 202632781 U | 12/2012 |
| CN | 103456341 A | 12/2013 |
| CN | 104685568 A | 6/2015 |
| CN | 105027085 A | 11/2015 |

OTHER PUBLICATIONS

Chinese Patent Office, "Notice of Allowance," issued in connection with Chinese Patent Application No. 202010423361.2 dated Apr. 21, 2023 (8 page; 4 pages original & 4 pages machine translation).

* cited by examiner

SELF-REFERENCE SENSING FOR MEMORY CELLS

CROSS REFERENCE

The present Application for Patent is a divisional of U.S. patent application Ser. No. 17/097,749 by Muzzetto, entitled "Self-Reference Sensing for Memory Cells," filed Nov. 13, 2020, which is a continuation of U.S. patent application Ser. No. 16/387,227 by Muzzetto, entitled "Self-Reference Sensing for Memory Cells," filed Apr. 17, 2019, which is a divisional of and claims priority to and the benefit of U.S. patent application Ser. No. 15/641,783 by Muzzetto, entitled "Self-Reference Sensing for Memory Cells," filed Jul. 5, 2017, each of which is assigned to the assignee hereof, and each of which is expressly incorporated by reference in its entirety herein.

BACKGROUND

The following relates generally to memory devices and more specifically to a self-reference sensing scheme for memory cells.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes, however, do not account for a variations within a memory cell. This may reduce the reliability of sensing operations of the memory cell.

BRIEF DESCRIPTION OF THE DRAWINGS

The disclosure herein refers to and includes the following figures.

DETAILED DESCRIPTION

Increased sensing reliability for memory cells may be realized with a sensing scheme that provides a voltage reference that is cell-specific or based on the memory cell selected. By first reading a particular memory cell and generating a reference value based on the read operation, a wider read margin can be attained. As described below, a cell having two transistors, or other switching components, and one capacitor, such as a ferroelectric capacitor, may be sensed using a reference value that is specific to the cell. The cell may be read and sampled via one access line, and the cell may be used to generate a reference voltage and sampled via another access line. For instance, a number of voltages may be applied across a first access line and second access line. The voltages may result in a specific voltage value across both access lines. These voltage values may be used in determining the stored logic state of the memory cell.

By way of example, a capacitor of a memory cell may store a charge representative of a particular logic state—for example, logic "1" or logic "0." In generating a read signal of the memory cell, a read voltage may be provided to the first of two access lines. The voltage of a second access line may be dependent upon the parasitic capacitance of the second access line. The value across the second access line may then be then provided to a sense amplifier to be used in determining the logic state of the particular ferroelectric memory cell, and potentially for subsequent writing operations.

Subsequently, in generating a voltage reference value, a read voltage may be provided to the second access line. The voltage across the first access line and second access line may be equivalent. This voltage value may then be provided to the sense amplifier. Upon receiving both the read signal and voltage reference value, the sense amplifier is able to better-account for variations within the ferroelectric memory cell. Further, the provided voltage values allow the sense amplifier to more-reliably determine the logic value of the ferroelectric memory cell.

Features of the disclosure introduced above are further described below in the context of a memory array. Circuits and cell characteristics for memory cells and arrays that support a self-referencing sensing scheme are then described. These and other features of the disclosure are further illustrated by and described with reference to apparatus diagrams, system diagrams, and flowcharts that relate to a self-referencing sensing scheme.

Figure 1:
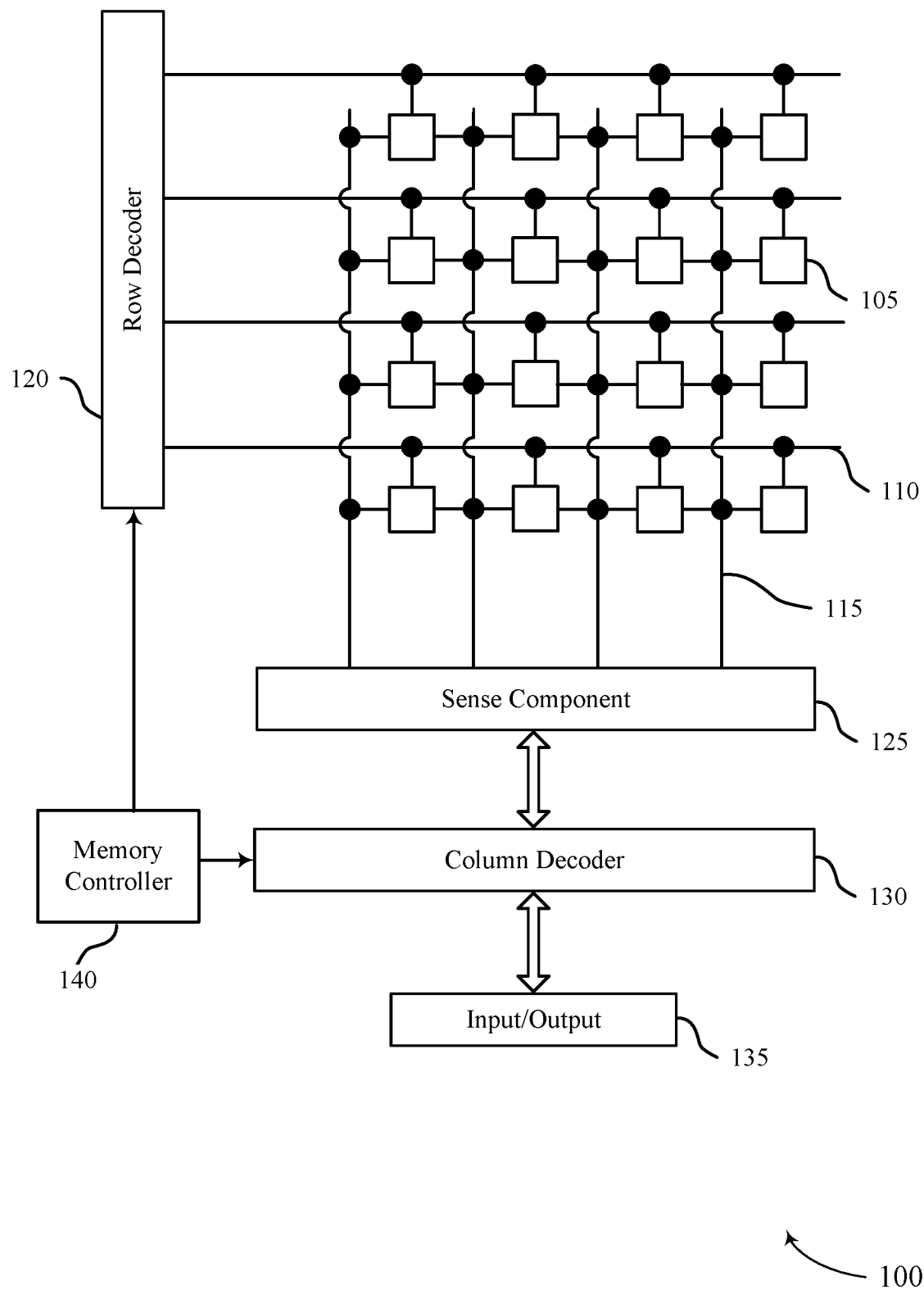
FIG. 1 illustrates examples memory array that supports a self-reference sensing scheme in accordance with examples of the present disclosure.

FIG. 1 illustrates examples memory array 100 that supports a self-referencing sensing scheme in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 may be configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines, and digit lines 115 may also be referred to as bit lines. In some examples, an additional line, such as a plate line, may be present. Both word lines 110 and digit lines 115 may be referred to as access lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like.

According to the example of FIG. 1, each row of memory cells 105 is connected to a single word line 110, and each column of memory cells 105 is connected to two digit lines 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit lines by a selection component. The connection to each digit line 115 may be via a separate switching component (e.g., transistor). The word line 110 may be connected to and may control the selection components. For example, the first selection component (e.g., selection component 220 described with reference to FIG. 2) may be a first transistor, the second selection component (e.g., selection component 222 described with reference to FIG. 2) may be a second transistor, and the word line 110 may be connected to the gate of each transistor. Thus, cells 105 may be referred to as two-transistor, one-capacitor cells. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115.

Upon accessing memory cell 105, memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic "1" and vice versa. As described herein, the reference voltage may be generated from the cell 105 being sensed.

Sense component 125 may include various transistors or amplifiers in order to detect and amplify a difference in the signals, which may be referred to as latching. The detected logic state of memory cell 105 may then be output through column decoder 130 as output 135. Sense component 125 may compare a value obtained by applying a first voltage to a first access line with a second value obtained by applying a second voltage to a second access line. This comparison may determine a logic value for a cell 105 that is based on a reference value that is specific to that cell 105. Sense component 125 may, as described below with reference to FIG. 4, compare a read signal (e.g., read signal 330-a described with reference to FIG. 3) and a reference value (e.g., reference value 335-a described with reference to FIG. 3) to determine the logic state of the cell 105. The difference between the read signal and the reference value may be related to the difference between the first read voltage and the second read voltage.

Sense component 125 may include various transistors or amplifiers in order to detect and amplify a difference in the signals, which may be referred to as latching. Sense component 125 may also include one or more nodes, for example a first node (e.g., node 425) and a second node (e.g., node 430) as described with reference to FIG. 4. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

As described herein, a memory cell 105 may be sensed several times. This type of scheme may involve applying a number of voltages across at least a first access line and a second access line. A first read voltage may be applied to a first access line, and a second read voltage may be applied across a second access line. The read voltage applied to the first access line may result in a first voltage across the second access line (e.g., VBlt (0) with reference to FIG. 3) and the read voltage applied to the second access line may result in a second voltage across the first access line (e.g., VBlc (0) with reference to FIG. 3). The read voltages applied across the first access line and the second access line may be representative of a read signal (e.g., read signal 330-a described with reference to FIG. 3) and a reference value (e.g., reference value 335-a described with reference to FIG. 3), respectively. The read signal and the reference value may be provided to sense component 125 for use in determining the logic state of the cell 105. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

As discussed below, ferroelectric memory cells 105 may have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, employing sensing schemes described herein in which a number of voltages are applied to a number of access lines to generate a read signal and a reference value may allow for a wider read margin to be attained.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
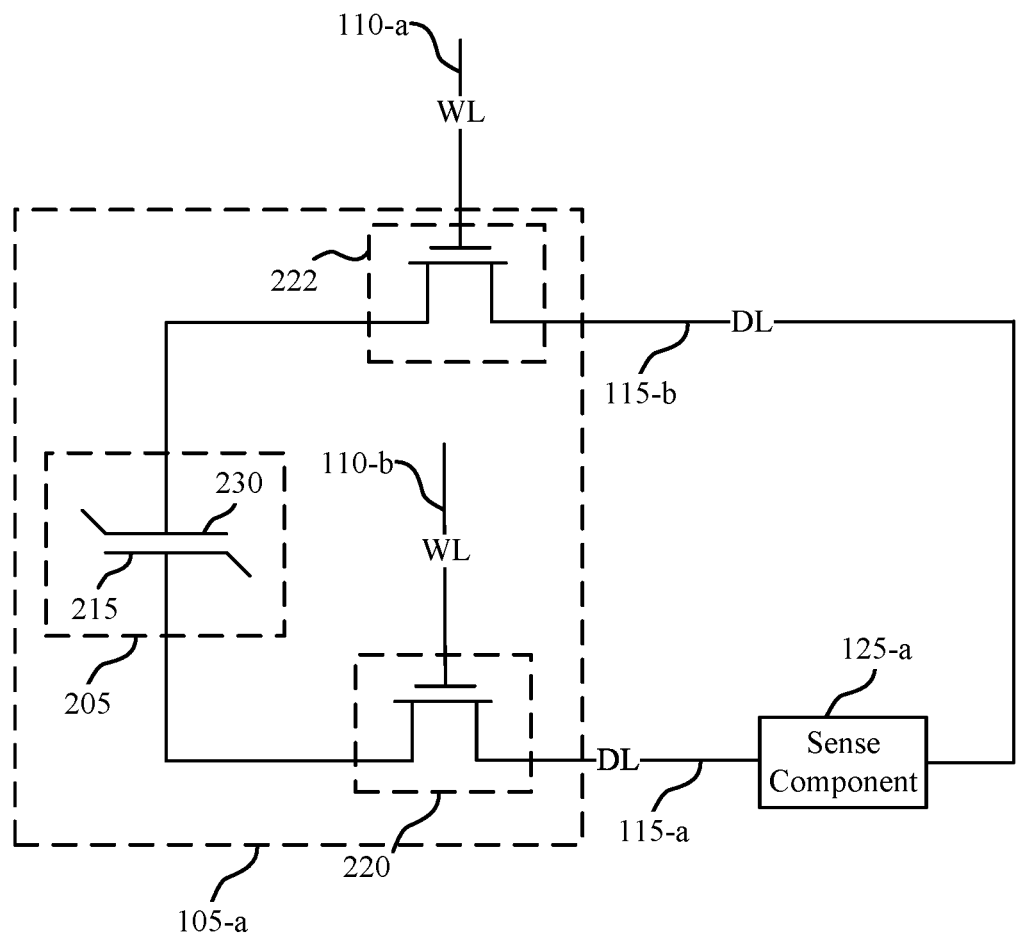
FIG. 2 illustrates examples circuit that supports a self-reference sensing scheme in accordance with examples of the present disclosure.

FIG. 2 illustrates examples circuit 200 that supports a self-referencing sensing scheme in accordance with various embodiments of the present disclosure. Circuit 200 includes a memory cell 105-a, word lines 110, digit lines 115, and sense component 125-a, which may be examples of a memory cell 105, word line 110, digit line 115, and sense component 125, respectively, described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes first selection component 220, second selection component 222. In some instances, only one of first selection component 220 and selection component 222 may be present. Cell plate 230 and cell bottom 215 may be accessed via digit lines 115-b and 115-a, respectively, and sense component 125-a may compare, for example, the read signal (e.g., read signal 330-a described with reference to FIG. 3) and reference value (e.g., reference value 335-a described with reference to FIG. 3). As described above, various states may be stored by charging or discharging capacitor 205.

The stored state of capacitor 205 may be read or sensed by operating various elements represented in circuit 200. Capacitor 205 may be in electronic communication with digit lines 115. For example, capacitor 205 can be isolated from digit line 115-a when first selection component 220 is deactivated, and capacitor 205 can be connected to digit line 115-a when first selection component 220 is activated. Activating first selection component 220 and second selection component 222 may be referred to as selecting memory cell 105-a. In some cases, first selection component 220 and second selection component 222 are transistors and their operation is controlled by applying a voltage to the transistor gate, where the voltage magnitude is greater than the threshold magnitude of the transistor. Word line 110-a may activate first selection component 220 or second selection component 222, or both; for example, a voltage applied to word line 110-a is applied to the transistor gate, connecting capacitor 205 with digit line 115-b.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to digit line 115-b. In some cases, digit line 115-a is virtually grounded and then isolated from the virtual ground, which may be referred to as "floating," prior to biasing digit line 115-b and word line 110-a. Biasing digit line 115-b may result in a voltage difference (e.g., digit line 115-b voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic "1" or a logic "0." This may cause a change in the voltage of digit line 115-a based on the charge stored on capacitor 205. The operations of digit lines 115-a and 115-b may be reversed to chase capacitor 205 to discharge onto digit line 115-b. As described herein, accessing a cell 105-a via digit line 115-a and 115-b in alternating fashion may be employed in a self-reference sensing scheme.

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference value by sense component 125-a in order to determine the stored logic state in memory cell 105-a. For example, the reference value may be obtained from digit line 115-b by accessing the memory cell 105 via digit line 115-a. Other sensing processes may be used.

Sense component 125-a may include various transistors or amplifiers to detect and amplify a difference in signals, which may be referred to as latching. Sense component 125-a may include a plurality of inverters. Sense component 125-a may also include a sense amplifier that receives and compares the voltage of digit line 115-a and a reference voltage, which may be referred to as a reference value.

Additionally or alternatively, sense component 125-a may compare, for example, the read signal (e.g., read signal 330-a described with reference to FIG. 3) and reference value (e.g., reference value 335-a described with reference to FIG. 3). The sense amplifier output may be driven to the higher (e.g., a positive) or lower (e.g., negative or ground (GND)) read voltage based on the comparison. Stated alternatively, the read voltage may be representative of the upper and lower-most values of a sense amplifier swing (e.g., $V_{cc}$ or GND). For instance, if digit line 115-a has a higher voltage than the reference voltage, then the sense amplifier output may be driven to a positive read voltage. In some cases, the sense amplifier may additionally drive digit line 115-a to the read voltage. Sense component 125-a may then latch the output of the sense amplifier and/or the voltage of digit line 115-a, which may be used to determine the stored state in memory cell 105-a, e.g., logic "1." Alternatively, if digit line 115-a has a lower voltage than reference voltage, the sense amplifier output may be driven to a negative or ground voltage. Sense component 125-a may similarly latch the sense amplifier output to determine the stored state in memory cell 105-a, e.g., logic "0." The latched logic state of memory cell 105-a may then be output, for example, through column decoder 130 as output 135 with reference to FIG. 1.

To write memory cell 105-a, a voltage may be applied across capacitor 205. Various methods may be used. In one example, first selection component 220 may be activated through word line 110-b in order to electrically connect capacitor 205 to digit line 115-a. A voltage may be applied across capacitor 205 by controlling the voltage of cell plate 230 (through digit line 115-b) and cell bottom 215 (through digit line 115-a). To write a logic "0," cell plate 230 may be taken high, that is, a positive voltage may be applied to digit line 115-b, and cell bottom 215 may be taken low, e.g., virtually grounding or applying a negative voltage to digit line 115-a. The opposite process is performed to write a logic "1," where cell plate 230 is taken low and cell bottom 215 is taken high.

Figure 3:
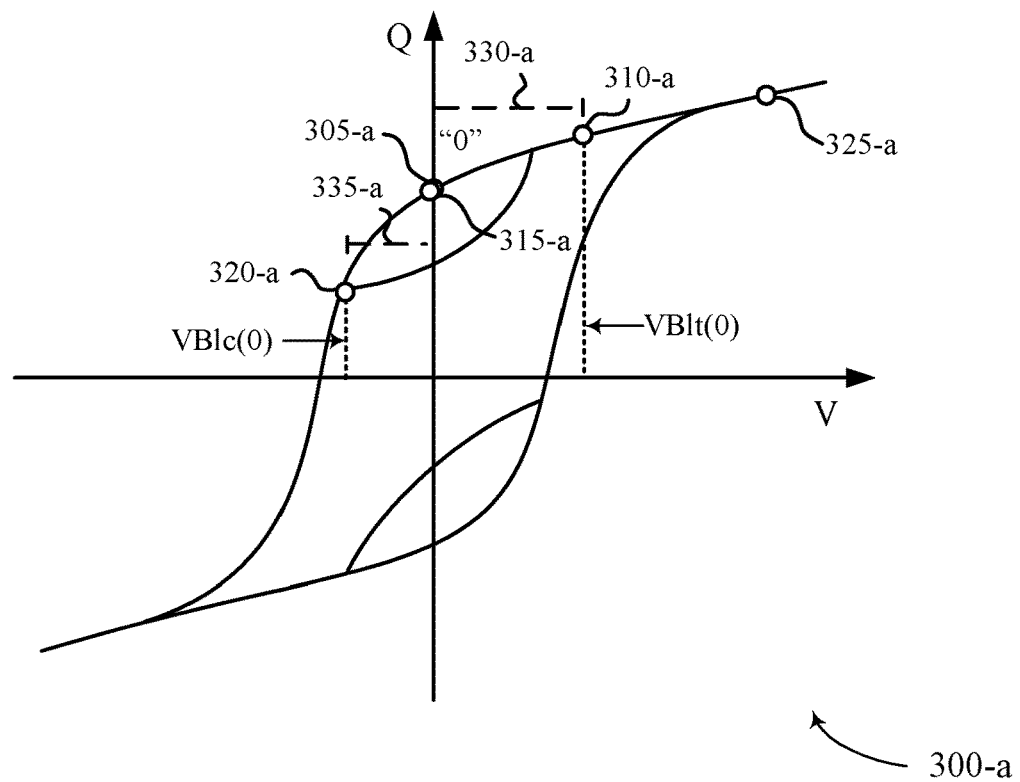
FIG. 3 illustrates example hysteresis curves for a cell that support a self-reference sensing scheme in accordance with examples of the present disclosure.
Figure 3:
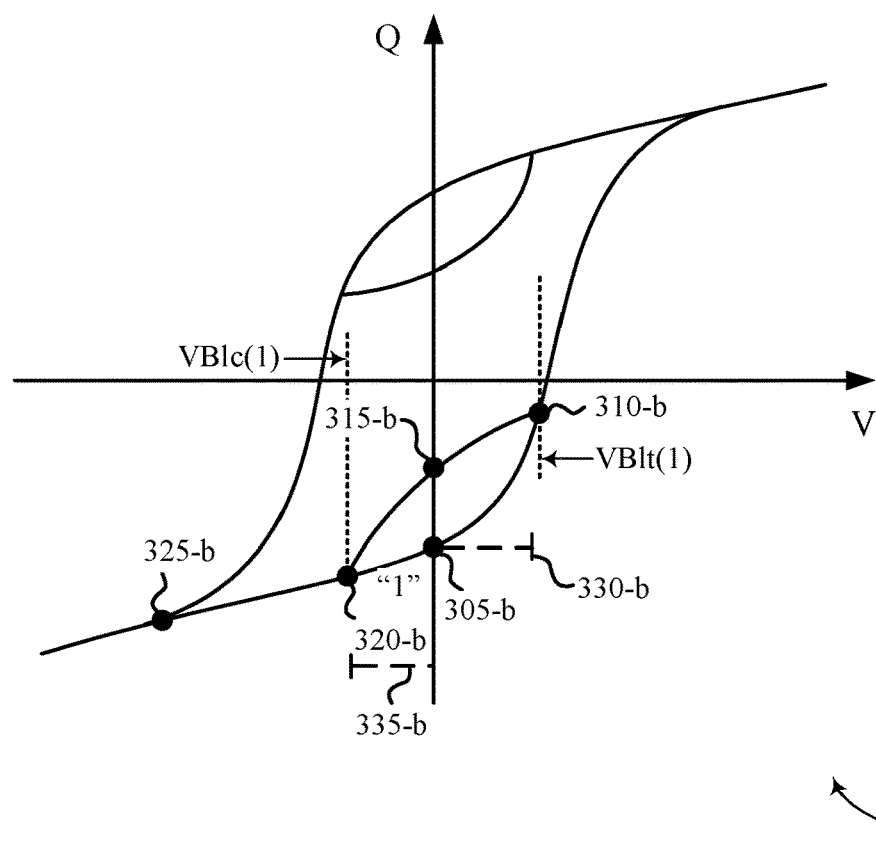
Figure 4:
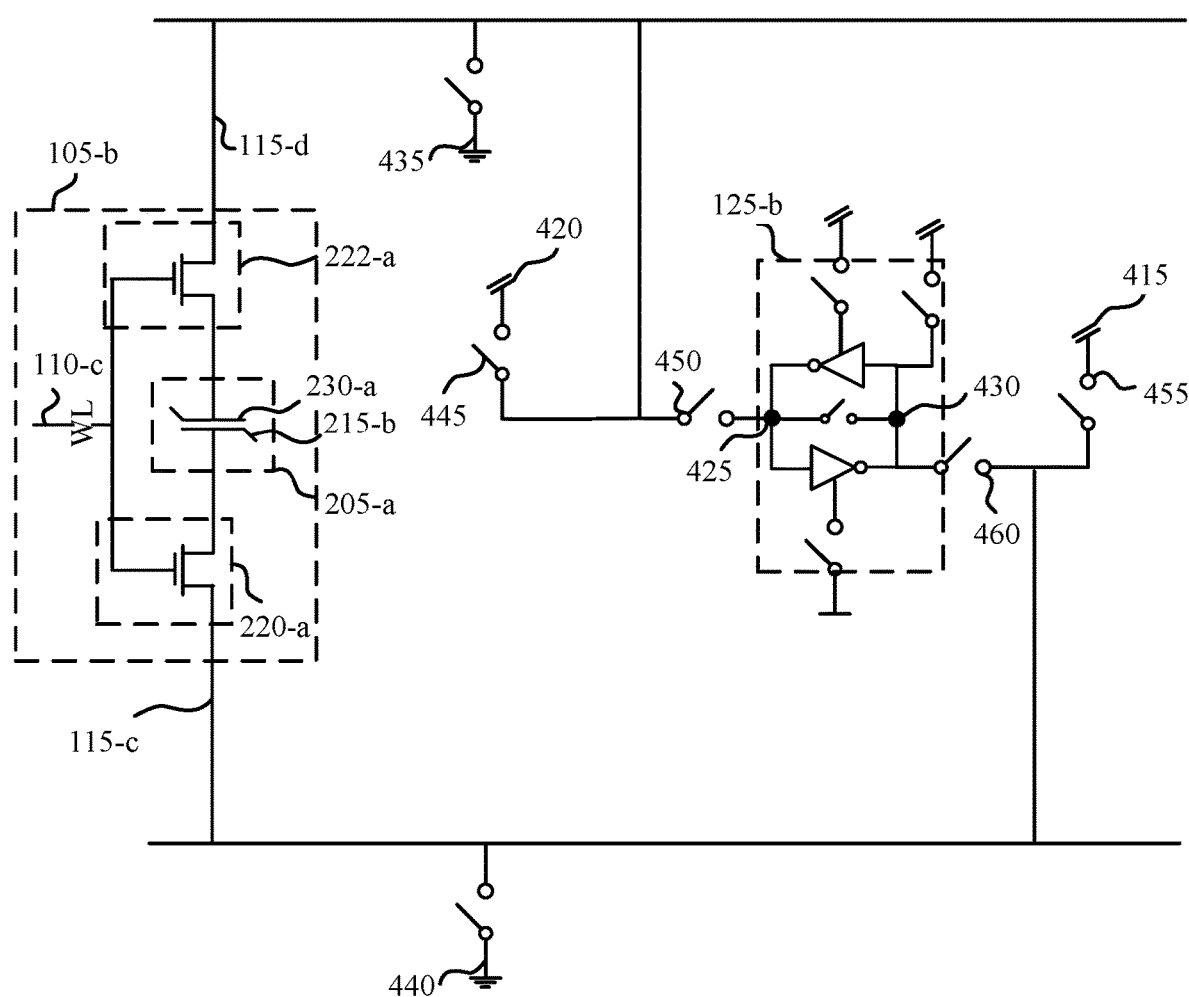
FIG. 4 illustrates examples circuit that supports a self-reference sensing scheme in accordance with examples of the present disclosure.

FIG. 3 illustrates examples of non-linear electrical properties with hysteresis curves 300-a and 300-b for a ferroelectric memory cell that is operated in accordance with various embodiments of the present disclosure. Hysteresis curves 300-a and 300-b illustrate writing and reading processes, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230, as shown in FIG. 2) and maintaining the second terminal (e.g., a cell bottom 215, as shown in FIG. 2) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive polarization with a zero voltage difference, resulting in possible charge state 305-a. According to the example of FIG. 3, charge state 305-a represents a logic "0." In some examples, the logic values of the respective charge states may be reversed to accommodate other schemes for operating a memory cell.

As depicted in hysteresis curve 300-b, the ferroelectric material may maintain a negative polarization with a zero voltage difference, resulting in possible charge state 305-b. According to the example of FIG. 3, charge state 305-b represents a logic "1." In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying voltage. For example, applying a net positive voltage across the capacitor results in charge accumulation until charge state 310-a is reached. Upon removing the voltage, charge state 310-a follows the path depicted by hysteresis curve 300-*a* until it reaches charge state 315-*a* at zero voltage potential. Similarly, charge state 320-*a* is written by applying a net negative voltage to a capacitor. After removing the net negative voltage, a positive voltage is again applied, and charge state 320-*a* follows a path until it reaches charge state 325-*a*. Charge states 305-*a* and 305-*b* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*a* or 305-*b* was initially stored. Voltage may be applied across the capacitor as discussed with reference to FIG. 2. For example, in response to voltage, charge state 305-*a* may follow a specific path. Additionally, for example, if charge state 305-*b* was initially stored, then it follows a specific path. The final position of charge state depends on a number of factors, including the specific sensing scheme and circuitry.

As depicted in hysteresis curve 300-*a*, a voltage (e.g., VBlt(0)) may be applied to a first access line, resulting in charge state 310-*a*). This step may represent generating a read signal 330-*a*, wherein the voltage depends on the logic state of the cell. Subsequently, the cell may be reset to zero (0V) and the charge state passes from 310-*a* to 315-*a*. Upon reaching charge state 315-*a*, a net negative voltage (e.g., VBlc(0) may be applied to a second access line, resulting in charge state 320-*a*). This step may represent generating a reference value 335-*a* of the particular memory cell. A voltage may then be re-applied to the memory cell, resulting in charge state 325-*a*. This step may represent writing a logic value to the cell. After the operation is completed (e.g., at charge state 325-*a*), the charge state of the cell may return to charge state 305-*a*.

Similarly, as depicted in hysteresis curve 300-*b*, a voltage (e.g., VBlt(1)) may be applied to a first access line, resulting in charge state 310-*b*). This step may represent generating a read signal 330-*b*, wherein the voltage depends on the logic state of the cell. Subsequently, the cell may be reset to zero (0V) and the charge state passes from 310-*b* to 315-*b*. Upon reaching charge state 315-*b*, a net negative voltage (e.g., VBlc(1)) may be applied to a second access line, resulting in charge state 320-*b*). This step may represent generating a reference value 335-*b* of the particular memory cell. A net negative voltage may be again-applied to the memory cell, resulting in charge state 325-*b*. This step may represent writing a logic value to the cell. After the operation is completed (e.g., at charge state 325-*b*), the charge state of the cell may return to charge state 305-*b*.

In some cases, the final charge may depend on the intrinsic capacitance of the digit line connected to the memory cell. For example, if the capacitor is electrically connected to the digit line and voltage is applied, the voltage of the digit line may rise due to its intrinsic capacitance. So a voltage measured at a sense component may not equal the voltage and instead may depend on the voltage of the digit line. The position of final charge states on hysteresis curves 300-*a* and 300-*b* may thus depend on the capacitance of the digit line and may be determined through a load-line analysis. As a result, the voltage of the capacitor may be different and may depend on the initial state of the capacitor. For example, a voltage (e.g., VBlt (0) or VBlt (1)) may develop across capacitor 205 when a same voltage is applied to a first access line. Similarly, for example, a voltage (e.g., VBlc (0) or VBlc (1)) may develop across capacitor 205 when applying a same voltage to a second access line.

By comparing the read signal to the reference value, the initial state of the capacitor may be determined. Upon comparison by the sense component, the read signal may be determined to be higher or lower than the reference value, and the stored logic value of the ferroelectric memory cell (i.e., a logic "0" or "1") may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow a specific path during a read operation and, after removing voltage, the charge state may return to initial charge state 305-*b* by following a path in the opposite direction.

FIG. 4 illustrates examples circuit 400 that supports a self-referencing sensing scheme in accordance with examples of the present disclosure. Circuit 400 includes first voltage source 415 and second voltage source 420, and virtual ground 435 and 440, which may each include switching components. Additionally, circuit 400 includes switching components 445, 450, 455, and 460 and nodes 425 and 430. In some examples, switching components 445, 450, 455, and 460 may be transistors. Additionally, circuit 400 may include first selection component 220-*a*, second selection component 222-*a*, memory cell 105-*b*, word line 110-*c*, digit lines 115-*c* and 115-*d*, cell plate 230-*a*, cell bottom 215-*b*, and capacitor 205-*b*, which may be examples of corresponding components described with reference to FIG. 2. Ferroelectric memory cell 105-*b* may be selected using selection component 220-*a* and selection component 222-*a* that are in electronic communication with ferroelectric capacitor 205-*a*. For example, selection component 220-*a* and selection component 222-*a* may be a transistor (e.g., a FET) and may be activated by a voltage applied to a gate of a transistor using word line 110-*c*.

As depicted in FIG. 4, read voltage 415 may be applied to a first access line, such as digit line 115-*c*, based on selecting ferroelectric memory cell 105-*a*. Upon applying read voltage 415, a voltage (e.g., VBlt (0)) may develop across a second access line, e.g., digit line 115-*d*. This voltage may depend on the charge state with respect to read voltage 415. In some examples, this voltage may result from a capacitive sharing between ferroelectric memory cell 105-*a* and the second access line. The voltage value across the second access line (e.g., read signal 330-*a* with reference to FIG. 3) may be sampled to a latch (e.g., sense component 125-*b*) at node 425. After sampling the voltage value to the latch at node 425, node 425 may be isolated. Similarly, read voltage 420 may be applied to the second access line, e.g., digit line 115-*d*, based on selecting ferroelectric memory cell 105-*a*. In some examples, read voltage 415 and read voltage 420 may be a same read voltage. Before applying read voltage 420, the first access line and second access line (e.g., digit lines 115) may be reset to zero (0V)—i.e., grounded—by connecting virtual ground 435 and/or virtual ground 440. When grounded, the memory cell 105-*a* may have a residual polarization due to applying read voltage 415. After grounding the access lines, read voltage 420 may be applied to second access line. Upon applying read voltage 420, a voltage (e.g., VBlc (0)) may develop across the first access line, e.g., digit line 115-*c*. This voltage may depend on the charge state with respect to read voltage 420. In some examples, this voltage may result from a capacitive sharing between ferroelectric memory cell 105-a and the first access line. Read voltage 420 may, for example, result in the voltage across the first access line being correlated to the residual polarization of memory cell 105-a. Upon applying read voltage 420, the voltage across first access line may be equivalent to the voltage across the second access line. This voltage value (e.g., reference value 335-a of FIG. 3) may be sampled to a latch at node 430. After sampling the voltage value to the latch at node 430, node 430 may be isolated. A logic value may then be written to the ferroelectric memory cell.

Additionally, for example, the first voltage across the second access line (e.g., VBlt (0)) and the second voltage across the first access line may be equivalent (e.g., VBlc (0)). A value of read voltage 415 and read voltage 420 may be selected based upon this determination. The value of read voltage 415 and read voltage 420 may be selected to create an offset in a comparison of the first voltage across the second access line (e.g., VBlt (0)) and the second voltage across the first access line (e.g., VBlc (0)).

Additionally or alternatively, for example, a first read voltage source and a second read voltage source may supply read voltage 415 read voltage 420. In some examples, read voltage 415 and read voltage 420 may be a same voltage. In such examples, read voltage 420 may be the same as read voltage 415 and the first and second read voltage sources may be the same voltage source. In other examples, the first read voltage source and the second read voltage source may supply different voltages. In such cases, read voltage 420 may be a higher voltage or a lower voltage than the read voltage 415. Thus the position on a hysteresis curve of the memory cell's states during the first portion of the access operation (e.g., 310-a or 310-b) and during the second portion of the access operation (e.g., 320-a or 320-b) may vary. For example, voltage VBlt(0) and VBlc(0) may be offset. Reading performances may be obtained in case of an equivalent or substantially equivalent difference between a sensed value (e.g., VBlt(0) or VBlt(1)) and corresponding reference value (e.g., VBlc(0) or VBlc(1)). In some examples, the value of read voltage 415 and read voltage 420 may be selected to create an offset in a comparison of the first voltage across the second access line (e.g., VBlt (0) or VBlt(1)) and the second voltage across the first access line (e.g., VBlc (0) or VBlc(1)).

Additionally, FIG. 4 depicts switching components 445, 450, 455, and 460, which may be opened or closed to facilitate access to nodes 425 or 430, first access line, and second access line. For example, when applying first read voltage 415 to first access line, switching component 460 may be open, while switching component 455 may be closed. Further, for example, when applying a voltage value to node 425, node 425 may be isolated by closing switching component 450 and opening switching component 460. Additionally or alternatively, for example, node 425 may be isolated by opening switching component 450, only. Similarly when applying a voltage value to node 430, node 430 may be isolated by closing switching component 460 and opening switching component 450. Additionally or alternatively, for example, node 430 may be isolated by opening switching component 460, only. Upon supplying voltage values to nodes 425 and 430, sense component 125-b may be operated to latch a logic value stored in memory cell 105-b. This operation may, for example, increase the voltage values applied to nodes 425 and 430 and may facilitate writing the logic value back to memory cell 105-b.

Figure 5:
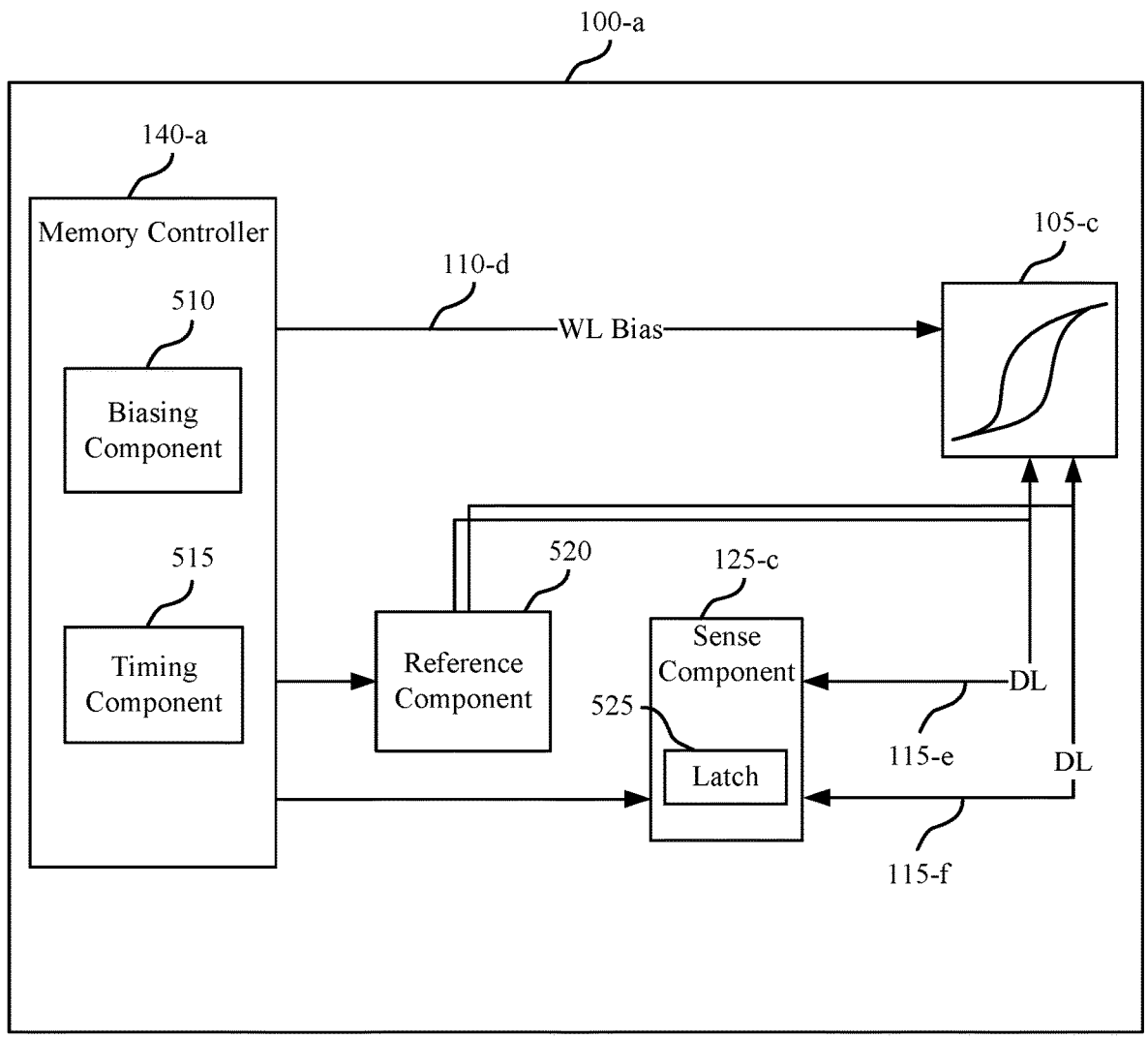
FIG. 5 illustrates examples ferroelectric memory array that supports a self-reference sense amplifier in accordance with examples of the present disclosure.

FIG. 5 shows a block diagram 500 of a memory array 100-a that supports self-referencing for ferroelectric memory in accordance with examples of the present disclosure. Memory array 100-a may be referred to as an electronic memory apparatus, and may be an example of a component of a memory controller 140-a as described with reference to FIG. 1.

Memory array 100-a may include one or more memory cells 105-c, a memory controller 140-a, a word line 110-d, a reference component 520, a sense component 125-c, digit lines 115-e and 115-f, and a latch 525. These components may be in electronic communication with each other and may perform one or more of the functions described herein. In some cases, memory controller 140-a may include biasing component 510 and timing component 515. Memory controller 140-a may be in electronic communication with word line 110-d, digit lines 115, and sense component 125-c, which may be examples of word line 110, digit line 115, and sense component 125, described with reference to FIGS. 1 and 2. In some cases, reference component 520, sense component 125-c, and latch 525 may be components of memory controller 140-a.

In some examples, digit lines 115-e and 115-f are in electronic communication with sense component 125-c and a ferroelectric capacitor (e.g., capacitor 205-a of FIG. 4) of ferroelectric memory cell 105-c. Ferroelectric memory cell 105-c may be writable with a logic state (e.g., a first or second logic state). Word line 110-d may be in electronic communication with memory controller 140-a and a selection component of ferroelectric memory cell 105-c. Sense component 125-c may be in electronic communication with memory controller 140-a, digit lines 115, latch 525. Reference component 520 may be in electronic communication with digit lines 115. These components may also be in electronic communication with other components, both inside and outside of memory array 100-a, in addition to components not listed above, via other components, connections, or busses.

Memory controller 140-a may be configured to activate word line 110-d or digit lines 115 by applying voltages to those various nodes. For example, biasing component 510 may be configured to apply a voltage to operate memory cell 105-c to read or write memory cell 105-c as described above. In some cases, memory controller 140-a may include a row decoder, column decoder, or both, as described with reference to FIG. 1. This may enable memory controller 140-a to access memory cell 105-c. Biasing component 510 may also provide voltages to reference component 520 in order to generate a self-reference signal for sense component 125-c. For example, biasing component 510 may provide different read voltages to sense component 125-c via reference component 520. Additionally, biasing component 510 may provide voltages for the operation of sense component 125-c.

In some cases, memory controller 140-a may perform its operations using timing component 515. For example, timing component 515 may control the timing of the various word line selections or plate biasing, including timing for switching and voltage application to perform the memory functions, such as reading and writing, discussed herein. In some cases, timing component 515 may control the operations of biasing component 510.

Reference component 520 may include various components to generate a self-reference signal for sense component 125-c. Reference component 520 may include circuitry, including various switching components to apply voltages to or to ground digit lines 115. In some examples, reference component 520 may be in electronic communication with sense component 125-c. Sense component 125-c may compare a signal from memory cell 105-c (through digit line 115-c) with a reference signal from reference component 520.

Upon determining the logic state, the sense component may then store the output in latch 525, where it may be used in accordance with the operations of an electronic device that memory array 100-a is a part. Sense component 125-c may include a sense amplifier in electronic communication with the latch 525 and the ferroelectric memory cell. For example, latch 525 may be in electronic communication with the first access line and second access line via a plurality of switching components (as shown in FIG. 4, for example).

The latch 525 may be in electronic communication with the first access line (e.g., digit line 115-e) via a first switching component and also in electronic communication with the second access line (e.g., digit line 115-f) via a second switching component. Further, a first voltage source may be in electronic communication with both the first access line and the latch via a third switching component. A second voltage source may be in electronic communication with both the second access line and the latch via a fourth switching component. Additionally, the first access line may be in electronic communication with a virtual ground via a fifth switching component and the second access line may be in electronic communication with a virtual ground via a sixth switching component. Latch 525 may be in further electronic communication with the first access line at a first node and be in electronic communication with the second access line at a second node. The first node and the second node may be in electronic communication via a seventh switching component. The various switching components described with reference to FIG. 5 may be within sense component 125-c; though not shown, such switching components may perform similar functions as those describe with reference to FIG. 4

Memory controller 140-a and/or at least some of its various sub-components may be implemented in hardware, software executed by a processor, firmware, or any combination thereof. If implemented in software executed by a processor, the functions of the memory controller 140-a and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 140-a and/or at least some of its various sub-components may be physically located at various positions, including being distributed such that portions of functions are implemented at different physical locations by one or more physical devices. In some examples, memory controller 140-a and/or at least some of its various sub-components may be a separate and distinct component in accordance with examples of the present disclosure. In other examples, memory controller 140-a and/or at least some of its various sub-components may be combined with one or more other hardware components, including but not limited to a receiver, a transmitter, a transceiver, one or more other components described in the present disclosure, or a combination thereof in accordance with examples of the present disclosure.

Memory controller 140-a may be in electronic communication with the first access line (e.g., digit line 115-e), second access line (digit line 115-d), and sense component 125—to control a first switching component, second switching component, third switching component, fourth switching component, fifth switching component, sixth switching component, and seventh switching component. For example, memory controller 140-a may apply a first read voltage to the first access line during a first portion of an access operation. After applying the first read voltage, memory controller 140-a may then apply a second read voltage to the second access line during a second portion of the access operation. Subsequently, memory controller 140-a may compare a first voltage of the first access line to a second voltage of the second access line during a third portion of the access operation, wherein the first voltage is based at least in part on the first read voltage and the second voltage is based at least in part on the second read voltage. Memory controller 140-a may determine a logic value associated with the ferroelectric memory cell based at least in part on comparing the first voltage of the first access line and the second voltage of the second access line.

Figure 6:
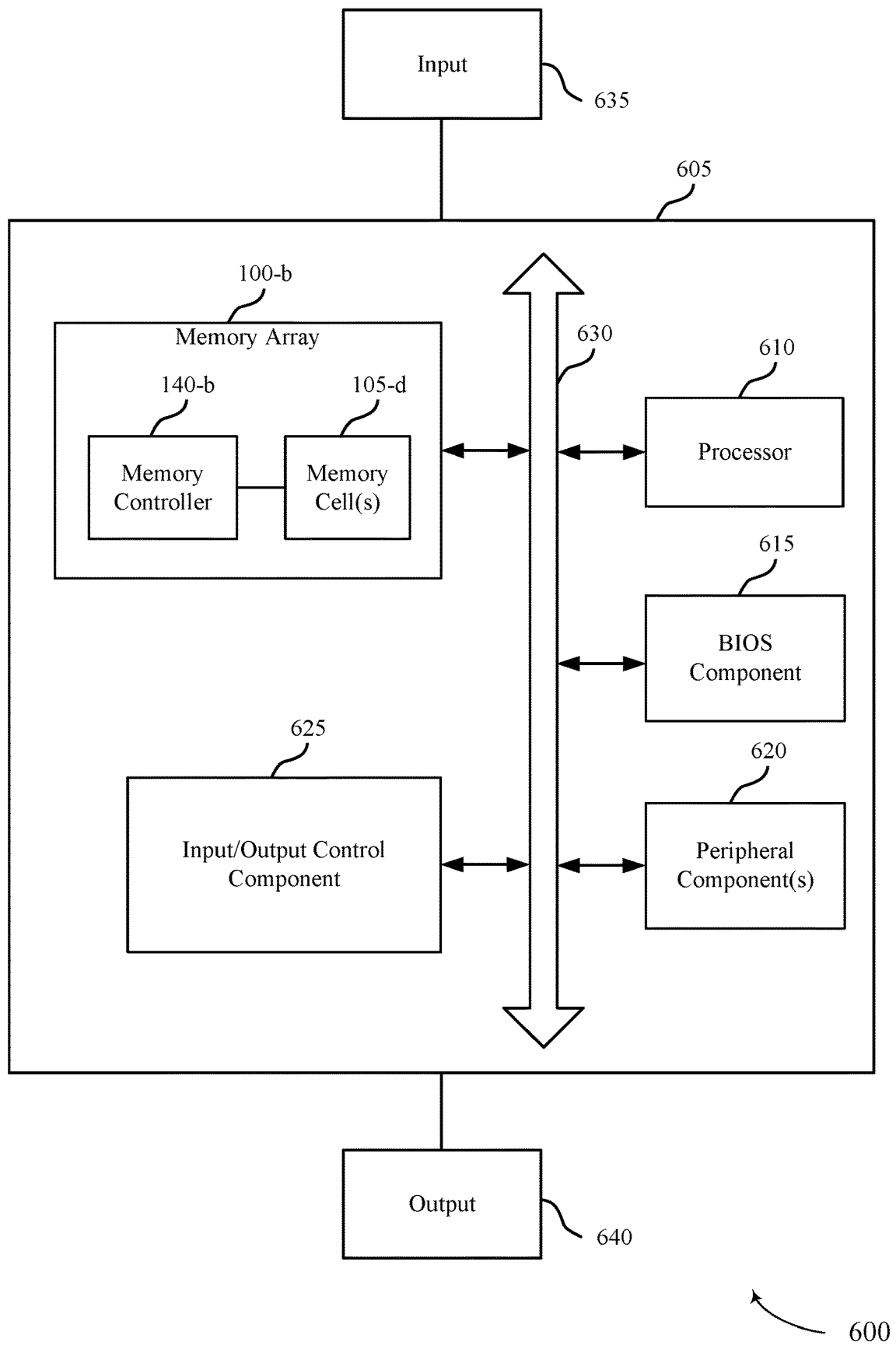
FIG. 6 illustrates a device, including a memory array, that supports a self-reference sense amplifier in accordance with examples of the present disclosure.

FIG. 6 shows a diagram of a system 600 including a device 605 that supports self-referencing for ferroelectric memory in accordance with examples of the present disclosure. Device 605 may include memory controller 140-b, which may be an example of memory controller 140 as described above with reference to FIG. 1. Device 605 may include components for bi-directional voice and data communications including components for transmitting and receiving communications, memory array 100-b that includes memory controller 140-b and memory cells 105-d, basic input/output system (BIOS) component 615, processor 610, I/O controller 625, and peripheral components 620. These components may be in electronic communication via one or more busses (e.g., bus 630). Memory cells 105-d may store information (i.e., in the form of a logical state) as described herein.

BIOS component 615 may be a software component that includes BIOS operated as firmware, which may initialize and run various hardware components. BIOS component 615 may also manage data flow between a processor and various other components, e.g., peripheral components, input/output control component, etc. BIOS component 615 may include a program or software stored in read only memory (ROM), flash memory, or any other non-volatile memory.

Processor 610 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 610 may be configured to operate a memory array using a memory controller. In other cases, a memory controller may be integrated into processor 610. Processor 610 may be configured to execute computer-readable instructions stored in a memory to perform various functions (e.g., functions or tasks supporting self-referencing for ferroelectric memory).

I/O controller 625 may manage input and output signals for device 605. I/O controller 625 may also manage peripherals not integrated into device 605. In some cases, I/O controller 625 may represent a physical connection or port to an external peripheral. In some cases, I/O controller 625 may utilize an operating system such as iOS®, ANDROID®, MS-DOS®, MS-WINDOWS®, OS/2®, UNIX®, LINUX®, or another known operating system.

Peripheral components 620 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 635 may represent a device or signal external to device 605 that provides input to device 605 or its components. This may include a user interface or an interface with or between other devices. In some cases, input 635 may be managed by I/O controller 625, and may interact with device 605 via a peripheral component 620.

Output 640 may also represent a device or signal external to device 605 configured to receive output from device 605 or any of its components. Examples of output 640 may include a display, audio speakers, a printing device, another processor or printed circuit board, etc. In some cases, output 640 may be a peripheral element that interfaces with device 605 via peripheral component(s) 620. In some cases, output 640 may be managed by I/O controller 625

The components of device 605 may include circuitry designed to carry out their functions. This may include various circuit elements, for example, conductive lines, transistors, capacitors, inductors, resistors, amplifiers, or other active or inactive elements, configured to carry out the functions described herein. Device 605 may be a computer, a server, a laptop computer, a notebook computer, a tablet computer, a mobile phone, a wearable electronic device, a personal electronic device, or the like. Or device 605 may be a portion or component of such a device.

Figure 7:
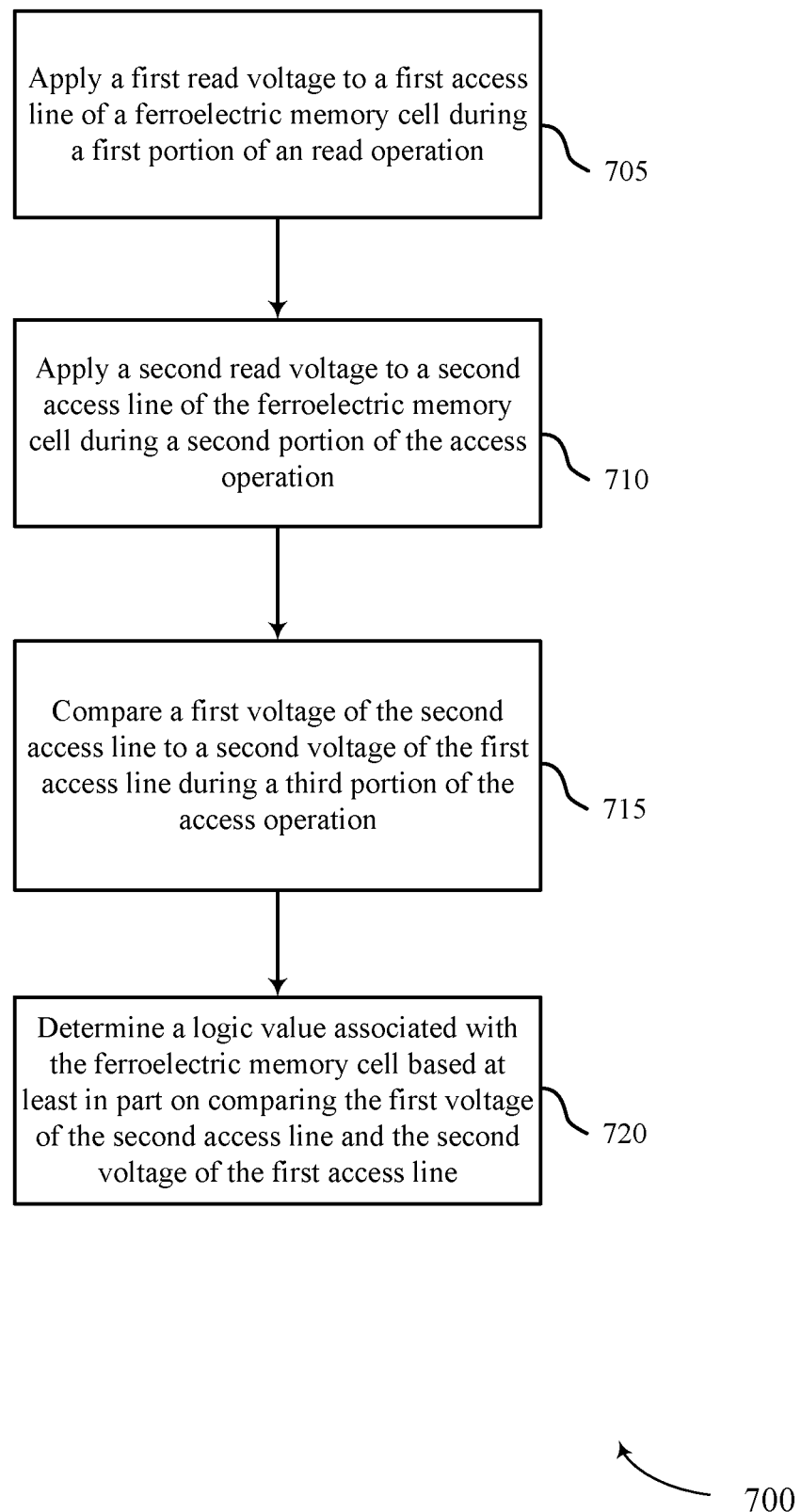
FIGS. 7-8 are flowcharts that illustrate a method or methods for a self-reference sensing scheme in accordance with examples of the present disclosure.

FIG. 7 shows a flowchart illustrating a method 700 for a self-referencing sensing scheme in accordance with examples of the present disclosure. The operations of method 700 may be implemented by memory controller 140-*a* described with reference to FIG. 5 or its components as described herein. In some examples, a memory controller may execute a set of codes to control the functional elements of the device to perform the functions described below. Additionally or alternatively, the memory controller may perform some or all of the functions described below using special-purpose hardware.

At block 705, method 700 may include applying a first read voltage to a first access line of a ferroelectric memory cell during a first portion of an access operation. The operations of block 705 may be implemented by memory controller 140-*a* or biasing component 510 described with reference to FIG. 5.

At block 710, method 700 may include applying a second read voltage to a second access line of the ferroelectric memory cell during a second portion of the access operation. The operations of block 710 may be implemented by memory controller 140-*a* or biasing component 510 described with reference to FIG. 5.

In some examples, the method may also include grounding or virtually grounding the first access line and the second access line after applying the first read voltage, wherein the second read voltage is applied after the grounding or virtual grounding. In some examples, a third voltage of the second access line during the first portion of the access operation is based at least in part on a polarization of the ferroelectric memory cell. In some examples, a fourth voltage of the first access line during the second portion of the access operation is based at least in part on a polarization of the ferroelectric memory cell. In some examples, a fourth voltage of the first access line during the second portion of the access operation is less than the third voltage of the second access line. In other examples, a fourth voltage of the first access line during the second portion of the access operation may be greater than the third voltage of the second access line.

At block 715, method 700 may include comparing a first voltage of the second access line to a second voltage of the first access line, during a third portion of the access operation, wherein the first voltage is based at least in part on the application of the first read voltage and the second—read voltage is based at least in part on the application of the second read voltage. The operations of block 715 may be implemented by memory controller 140-*a* or biasing component 510 described with reference to FIG. 5.

At block 720, method 700 may include determining a logic value associated with the ferroelectric memory cell based at least in part on comparing the first voltage of the second access line and the second voltage of the first access line. The operations of block 720 may be implemented by memory controller 140-*a* or biasing component 510 described with reference to FIG. 5. The method may also include writing the logic value to the ferroelectric memory cell during a fourth portion of the access operation. In some examples, the method may include a write back operation in which a cell is returned to a pre-sensing charge representative of the stored state.

Figure 8:
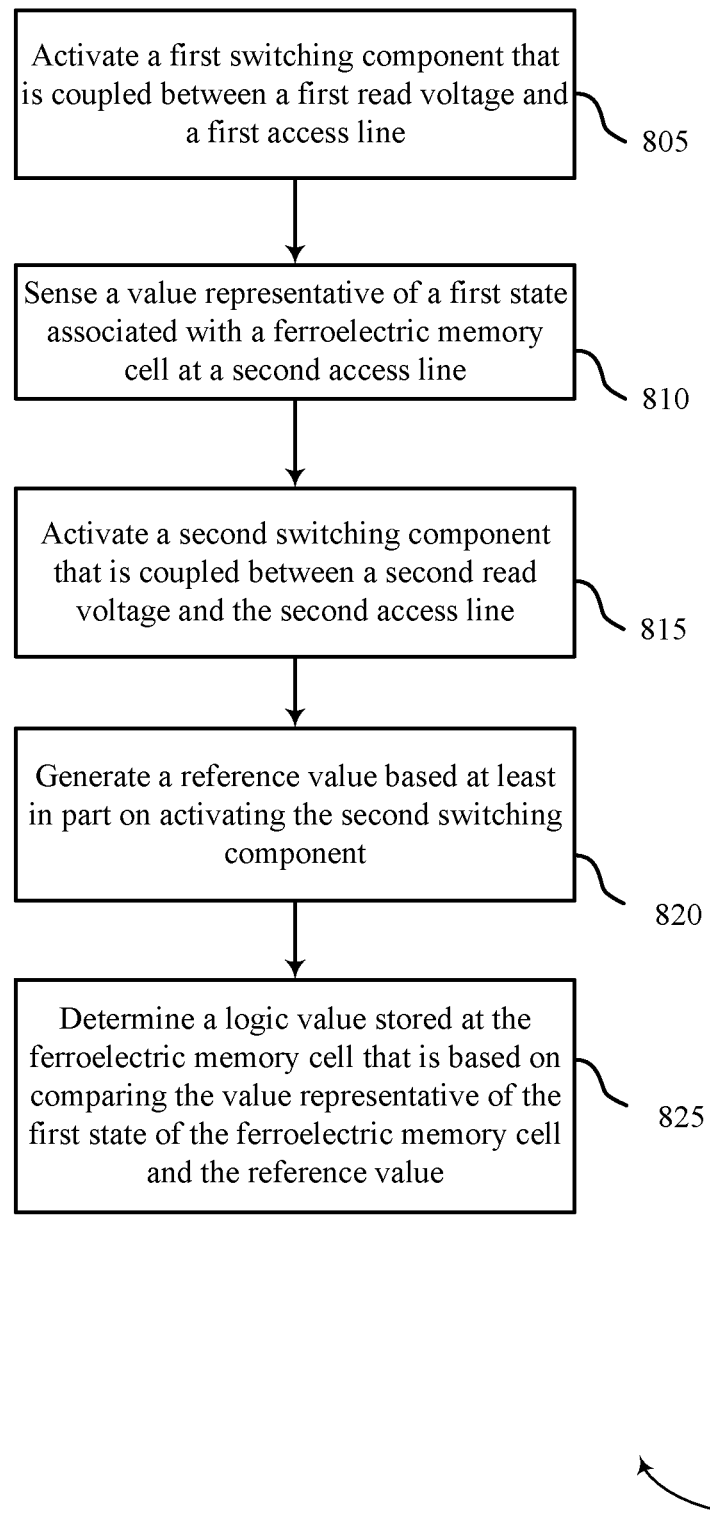

FIG. 8 shows a flowchart illustrating a method 800 for a self-referencing scheme in accordance with examples of the present disclosure. The operations of method 800 may be implemented by memory controller 140-*a* described with reference to FIG. 5 or its components as described herein. In some examples, a memory controller may execute a set of codes to control the functional elements of the device to perform the functions described below. Additionally or alternatively, the memory controller may perform some or all of the functions described below using special-purpose hardware.

At block 805, method 800 may include activating a first switching component that is coupled between a first read voltage and a first access line. The operations of block 805 may be implemented by memory controller 140-*a* or biasing component 510 described with reference to FIG. 5.

At block 810, method 800 may include sensing a value representative of a first state associated with a ferroelectric memory cell at a second access line after activating the first switching component. The operations of block 810 may be implemented by memory controller 140-*a* or sense component 125-*c* described with reference to FIG. 5.

At block 815, method 800 may include activating a second switching component that is coupled between a second read voltage and the second access line after sensing the first state. In some examples, the first read voltage source and the second read voltage source may be a same voltage source. Additionally or alternatively, for example, the second read voltage source may be a different voltage source than the first read voltage source. The operations of block 815 may be implemented by memory controller 140-*a* or biasing component 510 described with reference to FIG. 5.

At block 820, method 800 may include generating a reference value based at least in part on activating the second switching component. The operations of block 820 may be implemented by memory controller 140-*a* or reference component 520 described with reference to FIG. 5.

At block 825, method 800 may include determining a logic value stored at the ferroelectric memory cell, wherein the logic value is based at least in part on comparing the value representative of the first state of the ferroelectric memory cell and the reference value. The operations of block 825 may be implemented by memory controller 140-*a* or sense component 125-*c* described with reference to FIG. 5.

It should be noted that the methods described above describe possible implementations, and that the operations and the steps may be rearranged or otherwise modified and that other implementations are possible. Furthermore, some or all of the steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication" and "coupled" refer to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as examples, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   applying a first voltage to a first access line, wherein application of the first voltage develops a read signal across a second access line;
   sampling the read signal by a latch coupled to the second access line;
   applying a second voltage to the second access line, wherein application of the second voltage develops a reference value across the first access line, and wherein a value of the first voltage and a value of the second voltage are selected based at least in part on creating an offset between the read signal and the reference value;
   sampling the reference value by the latch coupled to the first access line; and
   determining a logic value stored in a memory cell coupled to the first access line and the second access line after sampling the reference value.

2. The method of claim 1, wherein a voltage across the first access line is equivalent to a voltage across the second access line after application of the second voltage.

3. The method of claim 1, further comprising:
   isolating the latch from the second access line after sampling the read signal based at least in part on opening a first switching component coupled to the latch and the second access line.

4. The method of claim 3, further comprising:
   isolating the latch from the first access line after sampling the reference value based at least in part on opening a second switching component coupled to the latch and the first access line.

5. The method of claim 1, further comprising:
   grounding the first access line and the second access line after sampling the read signal.

6. The method of claim 1, wherein determining the logic value further comprises:
   comparing the read signal to the reference value by a sense amplifier coupled to the first access line and the second access line.

7. A method, comprising:
   applying a first voltage to a first access line, wherein application of the first voltage develops a read signal across a second access line;
   sampling the read signal by a latch coupled to the second access line;
   closing a first switching component that is coupled to a voltage source associated with the first voltage;
   opening a second switching component that is coupled to the first switching component and the latch;
   applying a second voltage to the second access line, wherein application of the second voltage develops a reference value across the first access line;
   sampling the reference value by the latch coupled to the first access line; and
   determining a logic value stored in a memory cell coupled to the first access line and the second access line after sampling the reference value.

8. A method, comprising:
   applying a first voltage to a first access line, wherein application of the first voltage develops a read signal across a second access line;

sampling the read signal by a latch coupled to the second access line;
applying a second voltage to the second access line, wherein application of the second voltage develops a reference value across the first access line;
sampling the reference value by the latch coupled to the first access line;
determining a logic value stored in a memory cell coupled to the first access line and the second access line after sampling the reference value; and
supplying respective voltages to a first node and a second node coupled to the latch, wherein supplying the respective voltage to the first node comprises closing a first switching component that is coupled to the second access line and the latch and opening a second switching component that is coupled to a voltage source associated with the first voltage and the latch, and wherein supplying the respective voltage to the second node comprises closing the second switching component and opening the first switching component.

9. An apparatus, comprising:
a memory cell coupled to a first access line and a second access line;
a latch coupled to the first access line and the second access line; and
a controller configured to cause the apparatus to:
   apply a first voltage to the first access line, wherein application of the first voltage develops a read signal across the second access line;
   sample the read signal by the latch via the second access line;
   apply a second voltage to the second access line, wherein application of the second voltage develops a reference value across the first access line, and wherein a value of the first voltage and a value of the second voltage are selected based at least in part on creating an offset between the read signal and the reference value;
   sample the reference value by the latch via the first access line; and
   determine a logic value stored in the memory cell after sampling the reference value.

10. The apparatus of claim 9, wherein:
the read signal is based at least in part on a capacitive sharing between the memory cell and the second access line; and
the reference value is based at least in part on a capacitive sharing between the memory cell and the first access line.

11. The apparatus of claim 9, further comprising:
a first switching component and a second switching component, where in the controller is further configured to cause the apparatus to:
   close the first switching component and open the second switching component upon applying the first voltage; and
   close the second switching component and open the first switching component upon applying the second voltage.

12. The apparatus of claim 9, wherein the controller is further configured to cause the apparatus to:
write the logic value to the memory cell after sampling the reference value.

13. A non-transitory computer-readable medium storing code, the code comprising instructions executable by a processor to:
   apply a first voltage to a first access line, wherein application of the first voltage develops a read signal across a second access line;
   sample the read signal by a latch coupled to the second access line;
   apply a second voltage to the second access line, wherein application of the second voltage develops a reference value across the first access line, and wherein a value of the first voltage and a value of the second voltage are selected based at least in part on creating an offset between the read signal and the reference value;
   sample the reference value by the latch coupled to the first access line; and
   determine a logic value stored in a memory cell coupled to the first access line and the second access line after sampling the reference value.

14. The non-transitory computer-readable medium of claim 13, wherein a voltage across the first access line is equivalent to a voltage across the second access line after application of the second voltage.

15. The non-transitory computer-readable medium of claim 13, wherein the instructions are further executable by the processor to:
   isolate the latch from the second access line after sampling the read signal based at least in part on opening a first switching component coupled to the latch and the second access line.

16. The non-transitory computer-readable medium of claim 13, wherein the instructions are further executable by the processor to:
   ground the first access line and the second access line after sampling the read signal.

17. The non-transitory computer-readable medium of claim 13, wherein the instructions to determine the logic value are further executable by the processor to:
   compare the read signal to the reference value by a sense amplifier coupled to the first access line and the second access line.

18. A non-transitory computer-readable medium storing code, the code comprising instructions executable by a processor to:
   apply a first voltage to a first access line, wherein application of the first voltage develops a read signal across a second access line;
   sample the read signal by a latch coupled to the second access line;
   close a first switching component that is coupled to a voltage source associated with the first voltage;
   open a second switching component that is coupled to the first switching component and the latch;
   apply a second voltage to the second access line, wherein application of the second voltage develops a reference value across the first access line;
   sample the reference value by the latch coupled to the first access line; and
   determine a logic value stored in a memory cell coupled to the first access line and the second access line after sampling the reference value.

* * * * *